United States Patent [19]

Ott

[11] Patent Number: 4,644,193

[45] Date of Patent: Feb. 17, 1987

[54] ANALOG CIRCUIT FOR SIMULATING A DIGITALLY CONTROLLED RHEOSTAT

[75] Inventor: William E. Ott, San Pedro, Calif.

[73] Assignee: The United States of America as represented by the Secretary of the Air Force, Washington, D.C.

[21] Appl. No.: 596,863

[22] Filed: Apr. 4, 1984

[51] Int. Cl.[4] .......... H03K 5/02

[52] U.S. Cl. .......... 307/490; 307/264; 307/493; 333/81 R

[58] Field of Search .......... 307/260, 264, 490, 491, 307/493, 494; 333/81 R

[56] References Cited

U.S. PATENT DOCUMENTS

| | | | |
|---|---|---|---|
| 3,209,266 | 9/1965 | White | 307/490 |
| 3,445,681 | 5/1969 | Cattermole et al. | 307/494 |
| 3,947,701 | 3/1976 | Russell, Jr. | 307/264 |
| 4,168,528 | 9/1979 | Comer | 307/490 |
| 4,220,875 | 9/1982 | Lawton | 307/264 |
| 4,276,604 | 6/1981 | Kitamura et al. | 364/480 |
| 4,288,707 | 9/1981 | Katakura | 307/493 |
| 4,338,531 | 7/1982 | Corso | 307/540 |
| 4,408,514 | 10/1983 | Suzuki | 84/1.24 |

*Primary Examiner*—John Zazworsky
*Attorney, Agent, or Firm*—William G. Auton; Willard R. Matthews; Donald J. Singer

[57] ABSTRACT

The simulation of a two-wire rheostat is accomplished by an analog output circuit whose value is digitally controlled. It comprises a four-quadrant multiplying digital to analog converter (MDAC) and a current booster including active elements in the feedback loop of an amplifier. The digital rheostat acts as a variable resistance whose value is controlled by a digital controller and can accommodate either AC or DC excitations. The unit forms a negative feedback loop containing only solid-state devices and relies on fixed resistors for accuracy.

7 Claims, 3 Drawing Figures

FIG. 1
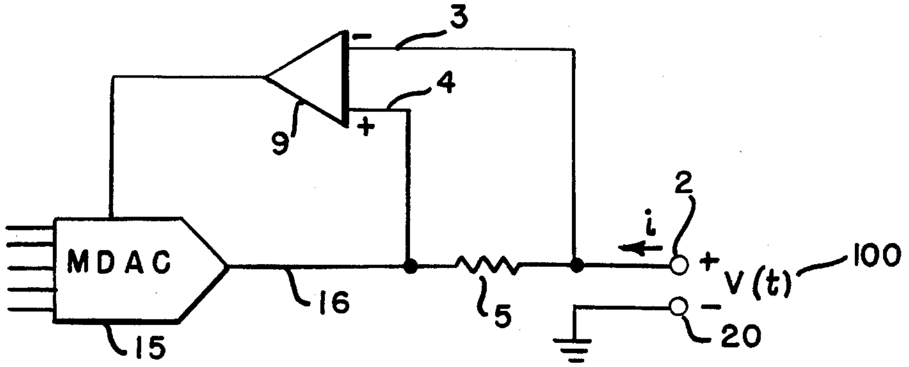
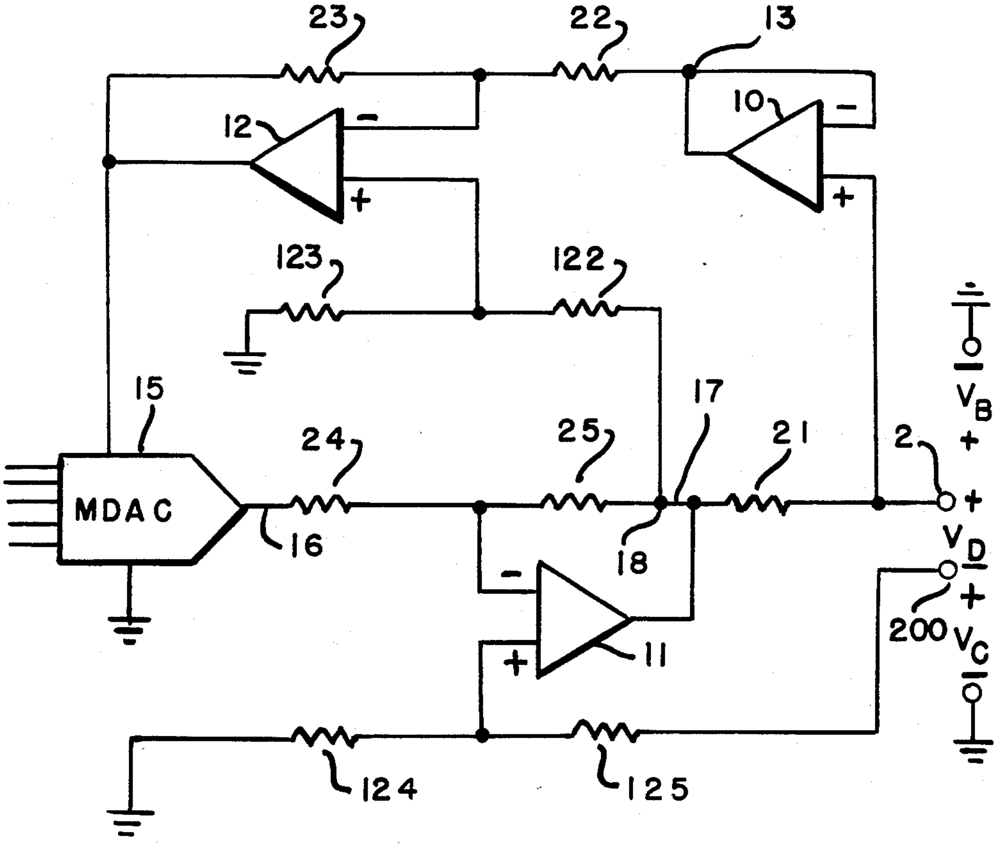
FIG. 2

ANALOG CIRCUIT FOR SIMULATING A DIGITALLY CONTROLLED RHEOSTAT

STATEMENT OF GOVERNMENT INTEREST

The invention described herein may be manufactured and used by or for the Government for governmental purposes without the payment of any royalty thereon.

BACKGROUND OF THE INVENTION

The present invention relates to digitally controlled variable impedance circuits and specifically to an analog output circuit which simulates a two-wire rheostat whose value is digitally controlled.

In the past, a number of circuits having a digitally controlled variable impedance have been developed. The extent of these prior art devices is given by the following patents:

U.S. Pat. No. 3,947,701 issued to Russell, Jr. on Mar. 30, 1976; U.S. Pat. No. 4,220,875 issued to Lawton on Sept. 2, 1980; U.S. Pat. No. 4,276,604 issued to Kitamura et al on June 30, 1981; U.S. Pat. No. 4,338,531 issued to Corso on July 6, 1982; and U.S. Pat. No. 4,408,514 issued to Suzuki on Oct. 11, 1983.

Each of the prior art devices requires an elaborate control circuit to translate the digital commands for the variable impedance circuit. Russell, Jr. discloses a digitally controlled variable impedance including a variable resistance connected to a counting register. The register is set to a predetermined count and operates to change the impedance value in response to receipt of each pulse of a pulse train. In Kitamura et al a digitally operated control circuit controls the attenuation factor of a variable loss attenuation circuit. The control circuit, which may be a microcomputer, is so programmed that the attenuation factor of the attenuation circuit is stepwisely increased. Suzuki shows a keyboard controlled circuit for a musical instrument including an amplifier. Lawton discloses a circuit having its impedance controlled by an external signal and which includes a feedback loop connecting the output of the second stage to the input of the first stage. Corso is directed to a duty cycle circuit for simulating a slide wire device.

Most of the above prior art devices employ bulky or relatively large components due to their elaborate control circuits which range from the microcomputer of Kitamura to a manually operated keyboard of the Suzuki device. In many applications, a digitally controlled variable resistor is required that is a single completely solid state circuit, including the control circuit.

In view of the foregoing discussion, it is apparent that there currently exists the need for an improved digitally controlled variable resistance circuit which, including the control curcuit, is a completely solid-state device. The present invention is directed towards satisfying that need.

SUMMARY OF THE INVENTION

This invention provides an analog output circuit which simulates a rheostat whose value is digitally controlled.

The simulation of a two-wire rheostat whose value is digitally controlled is accomplished by three amplifier circuits and a four-quadrant multiplying digital-to-analog converter. The first amplifier is connected with the current signal input into the rheostat circuit and produces an error signal that is used to reduce any system error induced by the loading of the input current signal. The second amplifier circuit receives the input current signal and produces an amplifier output signal equaling the value of the voltage generated by the input current signal minus the error signal produced by the first amplifier.

The four-quadrant multiplying digital-to-analog converter receives the amplifier output signal from the second amplifier circuit and externally generated digital instructions which are sent to the rheostat circuit. The four-quadrant multiplying digital-to-analog converter produces a controller output signal equaling the digital-to-analog converter gain value multiplied by the amplifier output signal. The gain value of the digital-to-analog-converter is varied with the digital instructions. The third amplifier circuit produces the rheostat output voltage potential by performing a differencing function between the controlled output signal and the voltage potential located at its second rheostat input terminal. The result of the above is a digitally controlled variable resistance circuit.

Accordingly, it is a principal object of this invention to provide an improved circuit having its impedance controlled by an external digital signal.

It is an object of this invention to provide a circuit whose impedance can be controlled by an external digital signal such that the circuit can be implemented in a single integrated circuit structure.

It is another object of the invention to provide an improved circuit whose impedance can be varied digitally over a range.

Finally, it is an object of this invention to provide an analog output circuit which simulates a two-wire rheostat whose value is digitally controlled.

These together with other objects features and advantages of the invention will become more readily apparent from the following detailed description when taken in conjunction with the accompanying drawings wherein like elements are given like reference numerals throughout.

DESCRIPTION OF THE DRAWINGS

FIG. 1 is a block diagram of an embodiment of the present invention;

FIG. 2 is an illustration of another embodiment of the present invention, and

DETAILED DESCRIPTION OF THE PREFERRED EMBODIMENT

Figure 3:
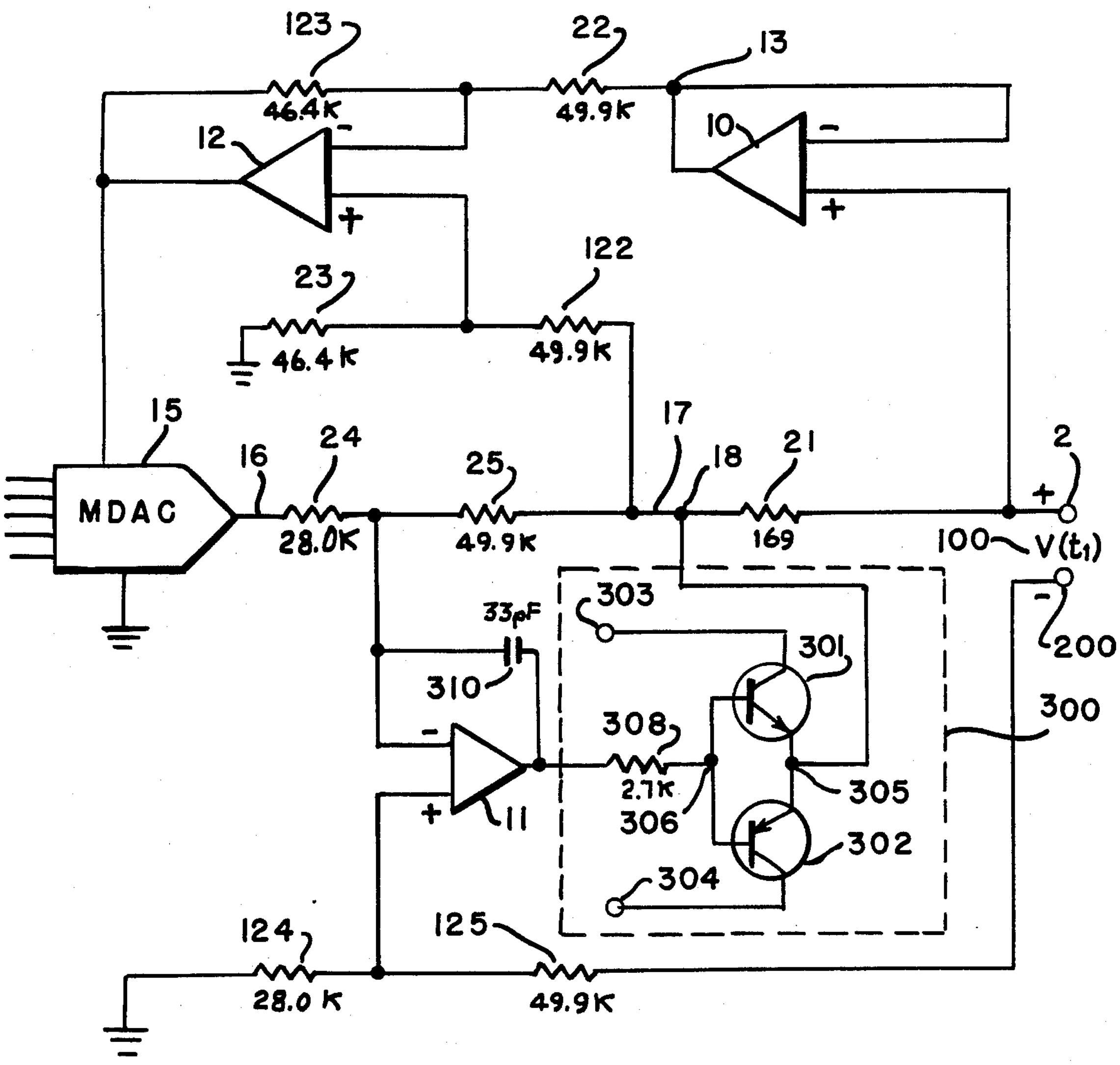
FIG. 3 is a functional block diagram of the preferred embodiment of the present invention.

This invention provides an analog output circuit which simulates a rheostat whose value is digitally controlled.

In order to simulate a rheostat and provide a variable resistance whose value is controlled by a digital signal, the invention uses a four-quadrant multiplying digital-to-analog converter (MDAC) and a current booster including elements in the feed back loop of an amplifier.

FIG. 1 is a block diagram of an emobidment of the subject invention. An input current of value $I_{(t)}$ enters the invention through the first interface terminal 2. This terminal 2 is connected to the inverting input terminal 3 of an amplifier 9 by one wire, and to the input resistor 5 of R ohms by another wire.

The amount of the input current i diverted into the inverting input terminal is zero for all practical purposes due to the impedance of the inverting input terminal and $I_{(t)}$ is conducted almost completely through the input resistor 5 and into the non-inverting input terminal of the amplifier 9.

The amplifier 9 of FIG. 1 may be characterized by the gain, which equals the ratio of the change in the output voltage to the change in the voltage of the non-inverting input terminal 4. This particular amplifier is characterized as having a low gain (1.0) and a high impedance in the inverting input terminal 3. Therefore, the change in the output voltage of the amplifier equals the change in the voltage of the non-inverting input terminal, and the high impedance of the inverting input terminal appears as an open circuit, which diverts, for all practical purposes, zero current from the amount of current I(t) entering the input resistor 5.

In the present invention, the amplifier 9 has a gain of 1.0 and produces an output voltage signal of value $V_{(A)} = -I(t) \times R$. The amplifier output terminal connects the amplifier output voltage with a four-quadrant multiplying digital-to-analog converter (MDAC) 15.

The MDAC 15 produces the MDAC output voltage signal appearing at point 16 of value $V_{(M)}$ which equals the gain of the MDAC multiplied by the voltage signal $V_{(A)}$ entering it. The MDAC is an element known in the art with a gain $K_{(DAC)}$ that is digitally controlled. In the present invention an MDAC was selected that varies its gain from −1.0 to +1.0. The operating characteristics of the MDAC result in a gain of:

+1.0 when the MDAC receives a digital input of 0000;

−1.0 when the MDAC receives a digital input of 1111; and 0 for a digital input of 0001.

The MDAC output signal is of value $V_{(M)}$ and is conducted in a feedback loop to the non-inverting terminal 4 of the amplifier 9.

Therefore, the resultant invention voltage output signal 100 is of value V(t) and equals the potential taken between the first input terminal 2 as described above, and a second terminal 20 connected with the electrical ground. The value of this voltage signal 100 is given by the equation:

$$V_{(t)} = I_{(t)}R + V_M \quad (1)$$

But $$V_{(M)} = K_{(DAC)} \times V_A = -K_{(DAC)} \times I_{(t)} R \quad (2)$$

Therefore the resultant output voltage $$V_{(t)} = I_{(t)} R (1 - K_{(DAC)}) \quad (3)$$

The circuit in FIG. 1 is a digitally controlled circuit providing a variable resistance of $$R_{(t)} = R (1 - K_{(DAC)}) \quad (4)$$

FIG. 2 is a block diagram of another embodiment of the present invention. The circuit in FIG. 2 simulates a two wire rheostat whose value is digitally controlled.

In order to simulate a two wire rheostat and provide a variable resistance whose value is controlled by a digital signal the invention uses a four-quadrant multiplying digital-to-analog converter (MDAC) 15, three amplifiers 10, 11 and 12, and nine resistors 21–25 and 122–125.

An input current of value $I_{(t)}$ enters the invention through the first interface terminal 2. This first interface terminal is connected to the non-inverting input terminal of the first amplifier 10 by one wire, and to the system input resistor 21 of $R_1$ ohms by another wire.

This first amplifier has a feed back loop from its output terminal into its inverting input terminal. The function of this first amplifier is to serve as a buffer amplifier, and reduce any induced system error due to the loading of the potential at the first interface terminal 2. The output signal of the first amplifier 13 is conducted by the second input resistor of value $R_2$ ohms into the inverting input terminal of the second operational amplifier 12.

This second amplifier 12 forms a difference amplification circuit which produces an output signal which equals a constant multiplied by the difference between the internal control voltage signal 17 and the buffer amplifier output signal 13.

The internal control voltage signal 17 is a reference signal of value $V_{(X)}$ which may be determined by the following equation:

$$V_{(X)} = V_{(B)} - I_{(t)} R_1 \quad (5)$$

where:

$V_B$ = the voltage at terminal 2 with respect to ground $V_C$ = the voltage at terminal 200 with respect to ground $V_D = V_B - V_C$ the voltage potential 100 across the simulated digitally controlled rheostat.

and $I_{(t)}$ is the input current 1 at the first interface terminal 2 and $R_1$ is the system input resistor 21.

The internal control voltage signal 17 is conducted through the third input resistor 122 into the non-inverting input terminal of the second amplifier 12 to perform the subtraction function described above. Also connected with the non-inverting input terminal of the second amplifier is the fourth input resistor 123 which is connected with the electrical ground.

The output terminal of the second amplifier 12 is connected to the first feedback resistor 23 which conducts the output signal of the second amplifier back into its inverting input terminal.

The output signal of the second amplifier 12 is a signal of value $V_{(A2)}$ which may be determined by the following equation:

$$V_{(A2)} = -\frac{R_3}{R_2} I_{(t)} R_1 \quad (6)$$

where $R_3$ equals the value in ohms of the first feedback resistor 23 and the fourth input resistor 123, which are identical in this design, and $R_2$ equals the value in ohms of the second input resistor 22 and the third input resistor 122 which are identical in this design.

The output signal of the second amplifier 12 is input into the four-quadrant multiplying digital-to-analog converter (MDAC) 15. The MDAC produces the MDAC output voltage signal 16 of value $V_{(M)}$ which equals the gain of the MDAC multiplied by the voltage signal entering it. The MDAC 15 has the same operating characteristics as described above for FIG. 1, having a gain of $K_{(DAC)}$ which range in value from −1.0 to +1.0 and may be varied digitally.

Unlike the rheostat of FIG. 1, this two-wired rheostat requires that the MDAC output voltage signal 16 be processed by a third amplifier. The third amplifier 11 performs a differencing function between the MDAC output voltage signal 16 and the voltage potential of value $V_c$ which is located at the second interface terminal 200.

To perform this differencing function, the MDAC output voltage signal 16 is conducted through the fifth input resistor 24 into the inverting input terminal of the third amplifier. The second interface terminal voltage potential is conducted by the sixth input resistor 125 into the non-inverting input terminal of the third amplifier. Also connected to the non-inverting input terminal of the third amplifier is the seventh input resistor 124 which is also connected with the electrical ground. The function of the sixth and seventh input resistors 125 and 124 is to sense the ground voltage of the using system and sum it with the MDAC output signal 16 to reduce the ground noise error.

The output terminal of the third operational amplifier is connected with the internal control terminal 18, which is connected with the system input resistor 21 and to a second feed back resistor 25, which in turn is connected to the inverting input terminal of the third amplifier.

The internal control voltage signal 17 of value $V_{(X)}$ has already been described as equaling $V_B - I_{(t)} R_1$. However the connection of the third amplifier 11 described above results in the internal control voltage signal 17 located at the internal control terminal 18 having the value of $V_{(X)}$ in which $$V_{(X)} = V_C - (R_5/R_4)\, V_{(MDAC)} \quad (7)$$

$V_{(X)}$ is the internal control voltage signal 17;

$V_C$ is the voltage potential located at the second interface terminal 200;

$R_5$ is the value in ohms of the sixth input resistor 125, which is identical to the second feedback resistor 25;

and $R_4$ is the value in ohms of the seventh input resistor 124, which is identical to the fifth input resistor 24.

But $$V_{(MDAC)} = K_{DAC}\, V_{(A2)} \quad (8)$$

and $$V_{(A2)} = -R_3/R_2 I_{(t)} R_1 \quad (9)$$

where $K_{DAC}$ equals the gain of the MDAC 15

$V_{A2}$ equals the output signal of the second amplifier 31

$R_3$ equals the ohms of the first feedback resistor 23, which is identical with the fourth input resistor 123; and $R_2$ equals the value of the second input resistor 122, which is identical with the third input resistor 123.

From the above, it is obvious that:

$$V_B - V_C = I_{(t)} \cdot R_1 \left( 1 + \frac{R_5}{R_4} \cdot \frac{R_3}{R_2} K_{DAC} \right) \quad (10)$$

where $V_c$ = the voltage potential at the second interface terminal 200;

$V_B$ = the voltage potential 100 at the first interface terminal 2;

$I_{(t)}$ = the current at the first interface terminal 2;

$R_1$ equals the system input resistor 21;

$R_2$ = the value of resistors 22 and 122;

$R_3$ = the value of resistors 23 and 123;

$R_4$ = the value of resistors 24 and 124; and $R_5$ = the value of resistor 25 and 125 as described above.

Therefore $$V_D = I_{(t)} R_1 \left( 1 + \frac{R_5}{R_4} \cdot \frac{R_3}{R_2} K_{(DAC)} \right) \quad (11)$$

In other words, the circuit described above simulates a two wire rheostat which provides a variable resistance of value $R_T$ whose value is given by:

$$R_T = R_1 \left( 1 + \frac{R_5 R_3}{R_4 R_2} \cdot K_{(DAC)} \right) \quad (12)$$

FIG. 3 is a functional block diagram of the preferred embodiment of the two-wire rheostat simulation circuit which was illustrated in FIG. 2. The MDAC 15, three amplifiers 10–12, and nine resistors 21–25 and 122–125 are identical to their like enumerated components in FIG. 2 and operate in the fashion described above.

The distinction between FIG. 3 and FIG. 2 is the addition of two features to make the embodiment of FIG. 3 a practical application of the invention as illustrated in FIG. 2. These two features are: a current booster circuit 300 and a feedback capacity 310, both of which work in conjunction of the third amplifier 11.

The current booster circuit 300 consists of two transistors 301 and 302, and resistor 308. The function of the current booster is to reduce the current output of the third amplifier 11 to a level substantially less than the level of the input current 1 of value $I_{(t)}$.

The current booster circuit consists of an input resistor 308 and a NPN transistor 301 and a PNP transistor 302. The input resistor 308 conducts the output signal of the third amplifier 11 into a transistor input terminal 306. The transistor input terminal 306 is the point where the base electrodes of the two transistors 301 and 302 are commonly connected. The collector terminal of transistor 301 is connected to a positive voltage potential set at 15 volts, and the collector terminal of transistor 302 is connected to a negative voltage potential set at −15 volts.

The emitter electrodes of transistors 301 and 302 are commonly connected at a current booster output terminal 305 which conducts the adjusted output signal of the third amplifier 11 into the internal control terminal 18 at a current level equal to the input current 1 which is of value $I_{(t)}$.

The feedback capacitor 310 is a 33 pF capacitor in the feedback loop of the third amplifier 11. Capacitor 310 connects the output of the third amplifier 11 with the inverting input electrode of the third amplifier 11. The practical application of capacitor 310 is to prevent parasitic oscillations and ensure stability.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. An analog output circuit simulating a rheostat whose value is digitally controlled which comprises:

a first input resistor receiving an input current;

amplifier means receiving said input current from said first input resistor, said amplifier means producing the amplifier output signal proportionate to the value of the product of said input current multiplied by the resistance of said first input resistor;

a controller means receiving digital instructions sent to said analog output circuit, said controller means receiving said amplifier output signal from said amplifier means, and producing a controller output signal equaling the product of the controller gain value multiplied by said amplifier output signal, said gain value being varied by said digital instructions;

first and second interface terminals, said first interface terminal receiving said input current from an external source, said first interface terminal conducting said input current to said first input resistor, said first and second interface terminals providing the rheostat output voltage potential, said rheostat output voltage potential equaling said controller output signal plus the voltage produced by said input current as it is conducted through said input resistor.

2. An analog output circuit simulating a rheostat whose value is digitally controlled as defined in claim 1 wherein said amplifier means comprises an amplifier having its inverting input terminal connected with said first interface terminal, said amplifier having its non-inverting input terminal connected with said input resistor, said amplifier producing said amplifier output signal on its output terminal, said output terminal conducting said amplifier output signal into said controller means, said amplifier having a feedback loop conducting said controlled output signal from said controller means into the non-inverting input terminal of said amplifier.

3. An analog output circuit simulating a rheostat whose value is digitally controlled as defined in claim 1 wherein said amplifier means comprises:

a buffer amplifier circuit connecting with said first interface terminal and reducing any system error induced by the loading of said input current by producing an output error signal;

first and second differencing amplifier circuits, said first differencing amplifier circuit receiving said input current from said first input resistor and said output error signal from said buffer amplifier circuit and producing said amplifier output signal, said amplifier output signal equaling the difference between the voltage produced by said input current and said output error signal, said amplifier output signal being input into said controller means, and said second differencing amplifier circuit receiving said controller output signal from said controller means and producing said rheostat output voltage potential by performing a differencing function between said controller output signal and the voltage potential located at said second interface terminal.

4. An analog output circuit simulating a rheostat whose value is digitally controlled as defined in claim 3 wherein said buffer amplifier circuit comprises:

a buffer operational amplifier having its non-inverting input terminal connected to said first interface terminal, and its output terminal connected in a feedback loop with its inverting input terminal.

5. An analog output circuit simulating a rheostat whose value is digitally controlled as defined in claim 3 wherein said first differencing amplifier circuit comprises:

second, third and fourth input resistors, said second input resistor connecting with said output terminal of said buffer amplifier circuit, said second input resistor conducting said output error signal generated by said buffer amplifier circuit;

said third input resistor receiving said input current from said first input resistor;

said fourth input resistor connecting said third input resistor with an electrical ground;

the first differencing amplifier circuit having its inverting input terminal receive said output error signal from said second input resistor, said first differencing amplifier circuit having its non-inverting input terminal connected with said third and fourth input resistor, said first differencing amplifier circuit sending said amplifier output signal through its output terminal into said controller means;

and a feedback resistor connecting the output terminal of said first differencing amplifier circuit to its inverting input terminal.

6. An analog output circuit simulating a rheostat whose value is digitally controlled as defined in claim 5 wherein said second differencing amplifier circuit comprises:

fifth, sixth and seventh input resistors, said fifth input resistor conducting said controller output signal into said second differencing amplifier circuit;

said sixth input resistor connecting said second differencing amplifier circuit with an electrical ground;

said seventh input resistor conducting the voltage potential from said second interface terminal into said second differencing amplifier circuit;

the second differencing amplifier receiving said controller output signal in its inverting input terminal, said second differencing amplifier having its non inverting input terminal connected with a common junction between said sixth input resistor and said seventh input resistor, said second differencing amplifier having its output terminal connected with the junction between said first input resistor and said third input resistor; and a feedback resistor connecting the output terminal of said second differencing amplifier with its inverting input terminal.

7. An analog output circuit simulating a rheostat whose value is digitally controlled as defined in claim 6 wherein said controller means comprises a four-quadrant multiplying digital-to-analog converter receiving said digital instructions and producing variations in the magnitudes of said controller gain value corresponding with changes in said digital instructions.

* * * * *